(12) United States Patent
Chang et al.

(10) Patent No.: US 12,421,600 B2
(45) Date of Patent: Sep. 23, 2025

(54) 2-IN-1 (UV-ASSISTED AND PLASMA ENHANCED) ALD AND ALE CHAMBER

(71) Applicant: SKY TECH INC., Hsinchu County (TW)

(72) Inventors: Jung-Hua Chang, Hsinchu County (TW); Ta-Hao Kuo, Hsinchu County (TW); Ching-Liang Yi, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 151 days.

(21) Appl. No.: 18/232,604

(22) Filed: Aug. 10, 2023

(65) Prior Publication Data

US 2025/0051912 A1 Feb. 13, 2025

(51) Int. Cl.
*C23C 16/455* (2006.01)

(52) U.S. Cl.
CPC .. *C23C 16/45536* (2013.01); *C23C 16/45527* (2013.01); *C23C 16/45548* (2013.01)

(58) Field of Classification Search
CPC ........ C23C 16/45502; C23C 16/45512; C23C 16/4552; C23C 16/45527; C23C 16/45536; C23C 16/45548; C23C 16/45561; C23C 16/45563; C23C 16/45565; C23C 16/45568; C23C 16/4557; C23C 16/45572; C23C 16/45574; C23C 16/45576; C23C 16/45578; C23C 16/4558; C23C 16/45587; H01J 37/32082; H01J 37/321; H01J 37/3211; H01J 37/3222; H01J 37/32357; H01J 37/3244; H01J 37/32449
See application file for complete search history.

(56) References Cited

U.S. PATENT DOCUMENTS

2003/0015293 A1* 1/2003 Obuchi ............. H01J 37/32082
156/345.35

* cited by examiner

*Primary Examiner* — Gordon Baldwin
*Assistant Examiner* — Joshua Reyes
(74) *Attorney, Agent, or Firm* — HDLS IPR SERVICES; Chun-Ming Shih (57) ABSTRACT

A UV-assisted and plasma-enhanced process method includes: providing a lower chamber and a reaction space defined therein; providing an upper cover, wherein the upper cover has a window and vent holes; sealing a chamber opening of the lower chamber with the upper cover to form a reaction chamber; providing an outer tube body and an inner tube body disposed in the outer tube body, the outer tube body covering the window and the vent holes, and the inner tube body connected to the window; providing a UV light source at a top end of the inner tube body; providing an induction coil around the outer tube body; inducing a first gas to a first gas chamber in the inner tube body and a second gas to the second gas chamber between the inner and outer tube bodies; and activating the UV light source and the induction coil optionally.

9 Claims, 9 Drawing Sheets

2-IN-1 (UV-ASSISTED AND PLASMA ENHANCED) ALD AND ALE CHAMBER

TECHNICAL FIELD

This disclosure relates to the enhancement of processes such as ALD or ALE, and in particular to a UV-assisted and plasma-enhanced process method and a 2-in-1 optoelectronic assisted process chamber design.

RELATED ART

In the process of Atomic Layer Deposition (ALD) or Atomic Layer Epitaxy (ALE), or other wafer surface processing procedures, UV assisted and plasma enhancement is applied to enhance deposition or epitaxy.

In the conventional process, the UV-assisted equipment and the plasma strengthening equipment are independent equipment, which means that UV-assisted and plasma strengthening can hardly be carried out at the same time, and must be carried out separately-assisted and plasma enhancement involves the transfer of wafers between different equipment, which affects the efficiency of ALD or ALE operations.

SUMMARY

In view of the above problem, this disclosure provides a UV-assisted and plasma-enhanced process method with integrated UV-assistance and plasma enhancement in a single process.

This disclosure provides a UV-assisted and plasma-enhanced process method comprising: providing a lower chamber; wherein the lower chamber includes a reaction space, wherein a top of the lower chamber is provided with an chamber opening; providing an upper cover; wherein the upper cover includes an upper surface and a lower surface, and the upper cover further includes a window and a plurality of vent holes communicating the upper surface and the lower surface, and the vent holes are arranged to surround the window; sealing the chamber opening with the upper cover to form a reaction chamber; providing an outer tube body and an inner tube body disposed in the outer tube body, a bottom end of the outer tube body covering the window and the vent holes, and a bottom end of the inner tube body connected to the window; wherein a first gas chamber is formed inside the inner tube body and the first gas chamber is connected to the window; and a second gas chamber is formed between the outer tube body and the inner tube body, and the second gas chamber is connected to the vent holes; providing a UV light source at a top end of the inner tube body for emitting an ultraviolet light into the first gas chamber; providing an induction coil around the outer tube body for inductively generating an electric field by providing a time-varying magnetic flux to the outer tube; inducing a first gas to the first gas chamber and inducing a second gas to the second gas chamber; and activating the UV light source and the induction coil optionally.

In one or more embodiments, the UV-assisted and plasma-enhanced process method further comprising providing a first spray head combined with the lower surface of the upper cover and covering the vent holes.

In one or more embodiments, the UV-assisted and plasma-enhanced process method further comprising providing a second spray head combined with the lower surface of the upper cover and covers an end of a precursor line located on that lower surface.

In one or more embodiments, the ratio between an outer diameter of the first spray head and an outer diameter of the second spray head is between 0.3 and 0.9.

In one or more embodiments, the ratio between an inner diameter of the inner tube and an inner diameter of the outer tube body is between 0.1 and 0.6.

In one or more embodiments, the step of providing the UV light source at the top of the inner tube body further comprises providing a spacer connected to the top ends of the outer tube body and the inner tube body, and combining the UV light source to the spacer; wherein the spacer includes a center opening and an outer chamber space, the center opening communicates with the first gas chamber, and the outer chamber space communicates with the second gas chamber.

In one or more embodiments, the UV-assisted and plasma-enhanced process method further comprising: disposing at least one first gas intake line within the spacer extending from an outer side surface of the spacer to the center opening, for receiving the first gas and introducing the first gas to the first gas chamber; and disposing at least one second gas intake line within the spacer extending from an outer side surface of the spacer to the outer chamber space, for receiving the second gas and introducing the second gas to the second gas chamber.

In one or more embodiments, the step of providing the outer tube body and the inner tube body further comprises disposing two transparent plates respectively sealing the top end and the bottom end of the inner tube body, so that the first gas chamber is sealed.

In one or more embodiments, before disposing the UV light source the method comprising providing an adapter ring combined with the UV light source and combined with the top ends of the outer tube body and the inner tube body, such that the UV light source is combined with the top end of the inner tube body through the adapter ring.

In one or more embodiments, the UV-assisted and plasma-enhanced process method providing a wafer holder located within the reaction space of the lower chamber; wherein the wafer holder is disposed corresponding to the lower surface of the upper cover; wherein the wafer holder includes a wafer chuck and a linear actuator, a top surface of the wafer chuck faces the lower surface of the upper cover, the linear actuator is connected to a bottom surface of the wafer chuck for linearly move the wafer chuck up and down.

This disclosure further provides a 2-in-1 optoelectronic assisted process chamber design, comprising: a lower chamber with an accommodating space, wherein a top of the lower chamber is provided with an chamber opening; an upper cover, including an upper surface and a lower surface; wherein the upper cover further includes a window and a plurality of vent holes communicating the upper surface and the lower surface, and the vent holes are arranged to surround the window; wherein the upper cover seals the chamber opening with the lower surface facing the reaction space to form a reaction chamber; an outer tube body with an bottom end disposed on the upper surface and covering the window and the vent holes; an inner body with an bottom end disposed on the upper surface and connected the window; wherein the inner tube body is disposed within the outer tube body; a first gas chamber is formed inside the inner tube body and the first gas chamber is connected to the window; and a second gas chamber is formed between the outer tube body and the inner tube body, and the second gas chamber is connected to the vent holes; a UV light source disposed on a top end of the inner tube body for emitting an ultraviolet light into the first gas chamber; and an induction coil disposed around the outer tube body for inductively generating an electric field by providing a time-varying magnetic flux to the outer tube.

In one or more embodiments, the 2-in-1 optoelectronic assisted process chamber further comprises a wafer holder located within the reaction space of the lower chamber; wherein the wafer holder is disposed corresponding to the lower surface of the upper cover. The wafer holder includes a wafer chuck, a linear actuator, and a biasing power source. A top surface of the wafer chuck faces the lower surface of the upper cover. The linear actuator is connected to a bottom surface of the wafer chuck for linearly move the wafer chuck up and down. and the wafer chuck is connected to the biasing power source and the biasing power source is configured to apply a bias voltage on the wafer chuck.

In one or more embodiments, the 2-in-1 optoelectronic assisted process chamber further comprises a first spray head combined with the lower surface of the upper cover and surrounding the window and covering the vent holes.

In one or more embodiments, the upper cover further includes a precursor line communicating the upper surface and the lower surface, and an end of the precursor line located on the upper surface is configured to connect to a precursor supply source, and the end of the precursor line on the lower surface is on the outer side of the vent holes.

In one or more embodiments, the 2-in-1 optoelectronic assisted process chamber further comprises a second spray head combined with the lower surface of the upper cover and covers an end of a precursor line located on that lower surface; wherein the ratio between an outer diameter of the first spray head and an outer diameter of the second spray head is between 0.3 and 0.9.

In one or more embodiments, the ratio between an inner diameter of the inner tube and an inner diameter of the outer tube body is between 0.1 and 0.6.

In one or more embodiments, the 2-in-1 optoelectronic assisted process chamber further comprises a spacer connected to the top ends of the outer tube body and the inner tube body, and the UV light source is combined with the spacer.

In one or more embodiments, the spacer further includes: at least one first gas intake line within the spacer extending from an outer side surface of the spacer to the center opening, wherein the first gas intake line is configured to be connected to a first gas source such that the first gas chamber communicates the first gas intake line through the center opening, and the first gas chamber is configured to receive the first gas and introduce the first gas to the first gas chamber; and at least one first gas intake line within the spacer extending from an outer side surface of the spacer to the outer chamber space, wherein the second gas intake line is configured to be connected to a second gas source such that the second gas chamber communicates with the second gas intake line through the outer chamber space, and the second gas intake line is configured to receive the second gas and introduce the second gas to the second gas chamber.

In one or more embodiments, the 2-in-1 optoelectronic assisted process chamber further comprises two transparent plates respectively sealing the top end and the bottom end of the inner tube body, so that the first gas chamber is sealed.

In one or more embodiments, the 2-in-1 optoelectronic assisted process chamber further comprises an adapter ring directly or indirectly connected to the top ends of the outer tube body and the inner tube body, wherein a top surface of the adapter ring matches the UV light source such that the UV light source is combined with the top end of the inner tube body through the adapter ring.

According to the UV-assisted and plasma-enhanced process method and the 2-in-1 optoelectronic assisted process chamber, UV-assisted and plasma-enhanced functions can be combined in a single design. A single design combines both UV-assisted and plasma-enhanced functions, or it can be implemented in either UV-assisted or plasma-enhanced without transferring wafers between different equipment, which can effectively increase the efficiency of the ALD/ALE process.

BRIEF DESCRIPTION OF THE DRAWINGS

This disclosure will become more fully understood from the detailed description given herein below for illustration only, and thus not limitative of this disclosure, wherein.

DETAILED DESCRIPTION

Figure 1:
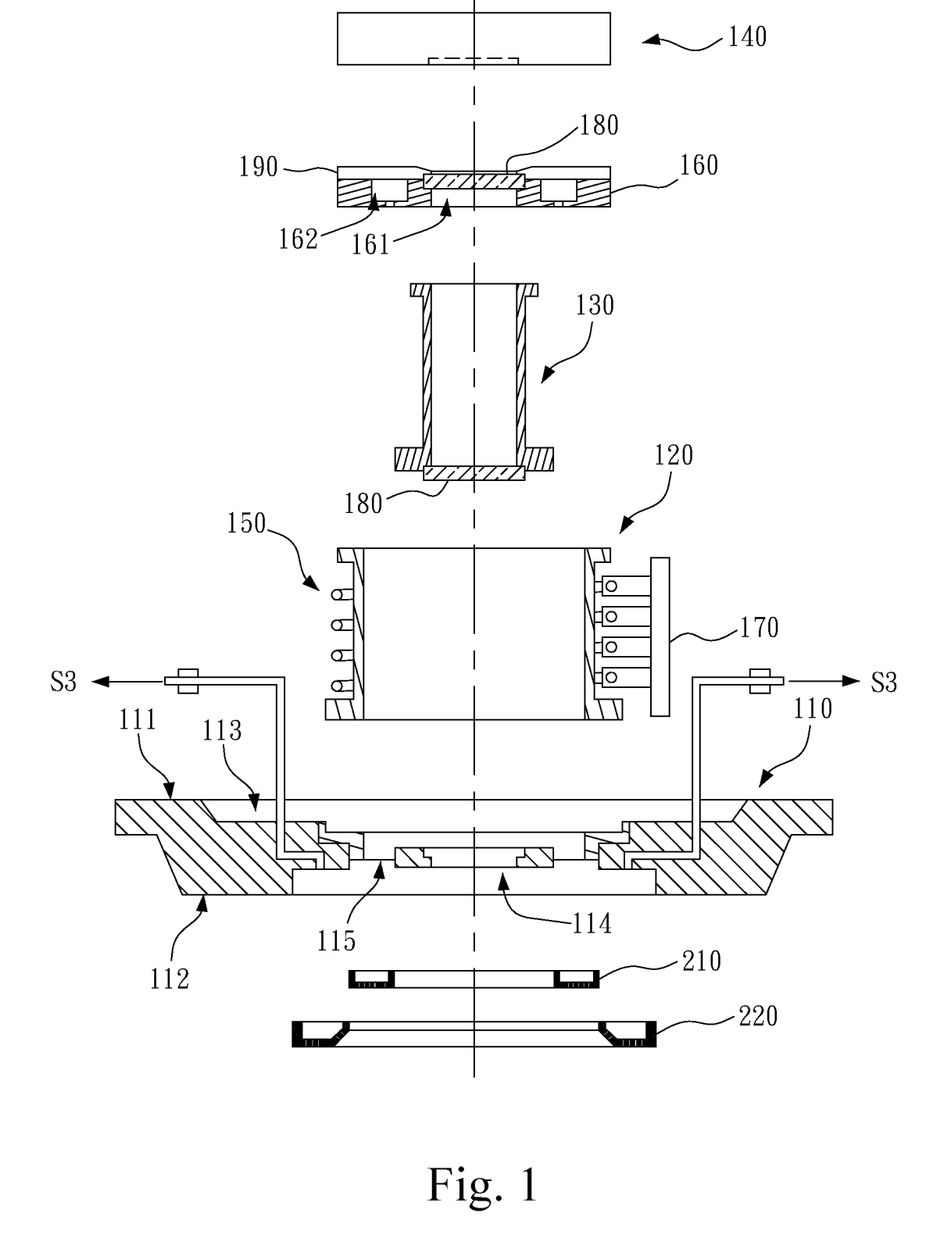
FIG. 1 is a cross-sectional exploded view of a 2-in-1 optoelectronic assisted process chamber in an embodiment of this disclosure.
Figure 2:
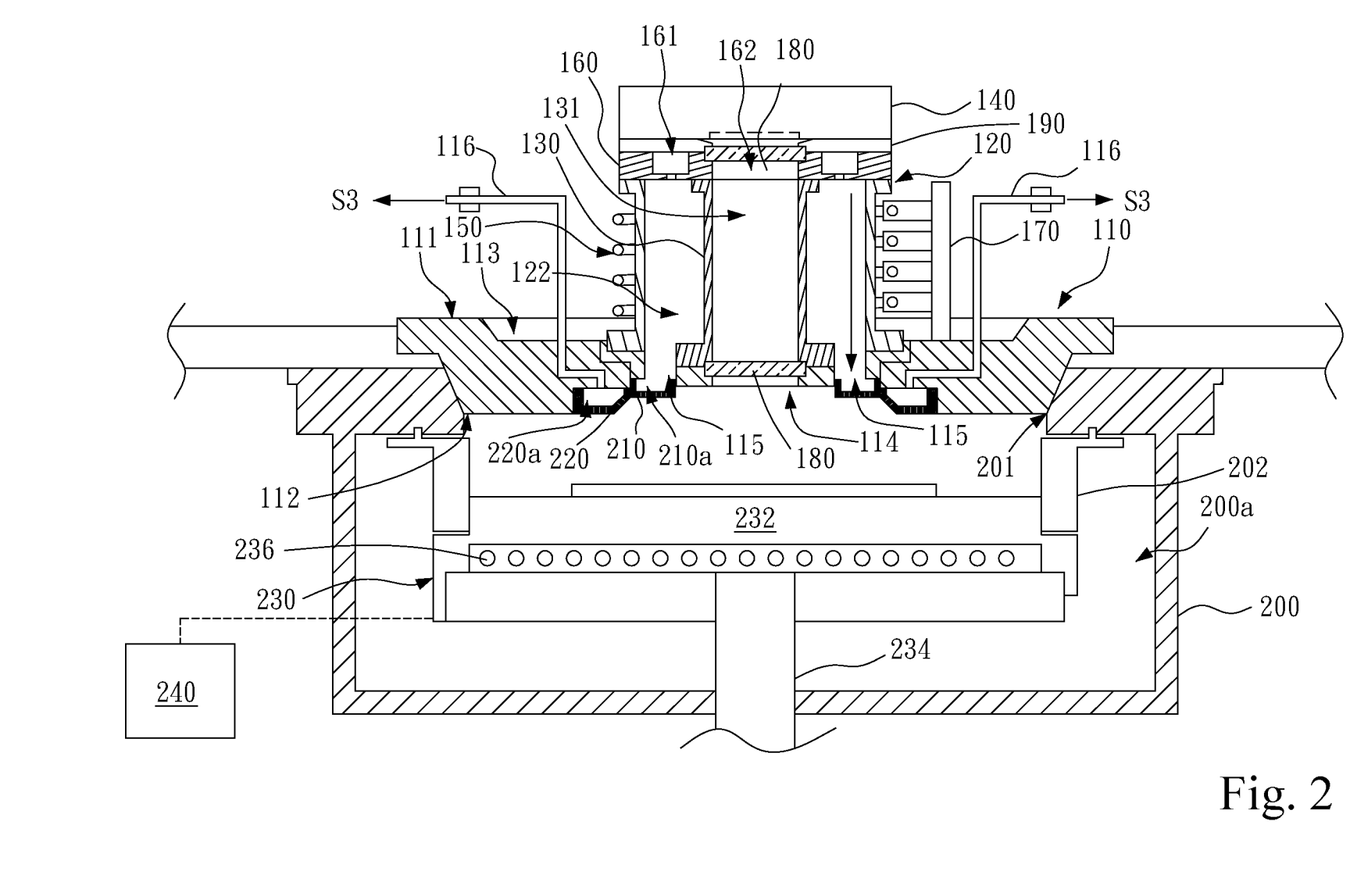
FIG. 2 is a cross-sectional view of the 2-in-1 optoelectronic assisted process chamber in the embodiment of this disclosure.

Referring to FIG. 1 and FIG. 2, a 2-in-1 optoelectronic assisted process chamber for performing UV-assisted and plasma-enhanced process method is disclosed according to an embodiment of this disclosure.

As shown in FIG. 1 and FIG. 2, The 2-in-1 optoelectronic assisted process chamber includes an upper cover 110, an outer tube body 120, an inner tube body 130, a UV light source 140, an induction coil 150 and a lower chamber 200.

As shown in FIG. 2, the lower chamber 200 includes a reaction space 200a. A top of the lower chamber 200 is provided with a chamber opening 201, and the chamber opening 201 communicates with the reaction space 200a.

As shown in FIG. 1 and FIG. 2, the upper cover 110 includes an upper surface 111 and a lower surface 112, and the upper surface 111 is provided with a recessed trough 113. The upper cover 110 further includes a window 114 and a plurality of vent holes 115 located in the recessed trough 113. The windows 114 and the vent holes 115 communicate the upper surface 111 and the lower surface 112, and the vent holes 115 are arranged to surround the window 114.

the upper cover 110 is disposed to the chamber opening 201 and seals the chamber opening 201. The lower surface 112 of the upper cover 110 faces the reaction space 200a, such that the outer tube body 120, the inner tube body 130, the UV light source 140, and the induction coil 150 are located outside the lower chamber 200, and bottom ends of the outer tube body 120 and the inner tube body 130 face the reaction space 200a to form a reaction chamber.

As shown in FIG. 1 and FIG. 2, The inner tube body 130 is located within the outer tube body 120. The bottom end of the outer tube body 120 covers the window 114 and the vent holes 115, and the bottom end of the inner tube body is connected to the window 114, such that the inner tube body 130 and the outer tube body 120 are connected to the reaction chamber.

As shown in FIG. 1 and FIG. 2, The outer body 120 may be a round tube, square tube, or other type of tube. The bottom end of the outer tube body 120 is disposed on the upper surface 111, and the bottom end of the outer tube body 120 covers the window 114 and the vent holes. The bottom end of the inner tube body 130 is disposed on the upper surface 111, and the bottom end of the inner tube body 130 is connected to the window 114. The inner tube body 1ep is located within the outer tube body 120. A first gas chamber 131 is formed inside the inner tube body 130 and the first gas chamber 131 is connected to the window 114. A second gas chamber 122 is formed between the outer tube body 120 and the inner tube body 130, and the second gas chamber 122 is connected to the vent holes 115.

As shown in FIG. 1 and FIG. 2, The UV light source 140 is disposed on a top end of the inner tube body 130 for emitting an ultraviolet light into the first gas chamber 131, so as to excite a first gas introduced into the first gas chamber 131 into an excited stage. Specifically, the optoelectronic assisted process chamber further includes a spacer 160 connected to the top ends of the outer tube body 120 and the inner tube body 130, and the UV light source 140 is combined with the spacer 160. The spacer includes a center opening 161 and an outer chamber space 162, and the outer chamber space 162 is adjacent to and on the outer side of the central opening 161. The center opening 161 communicates with the first gas chamber 131, and the outer chamber space 162 communicates with the second gas chamber 122. The UV light source 140 projects UV light through the center opening 161 to the first gas chamber 131. Specifically, Spectrum of the UV light is selected based on the first gas filled in the first gas chamber 131 such that the first gas is able to be excited by the UV light to emit an excited light having a predetermined wavelength.

Figure 3:
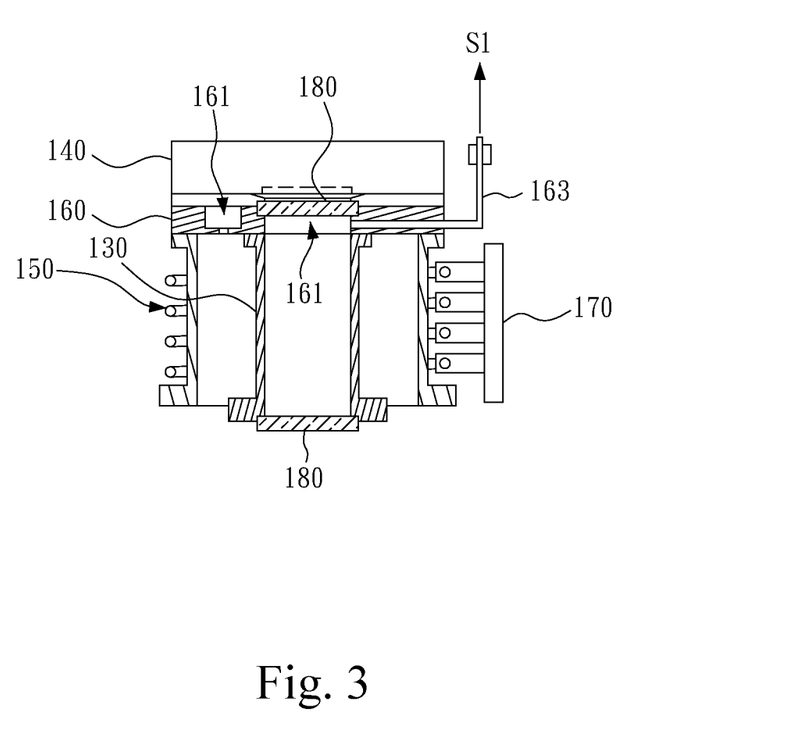
FIG. 3 and FIG. 4 are cross-sectional views of part of the components of the 2-in-1 optoelectronic assisted process chamber in the embodiment of this disclosure.
Figure 4:
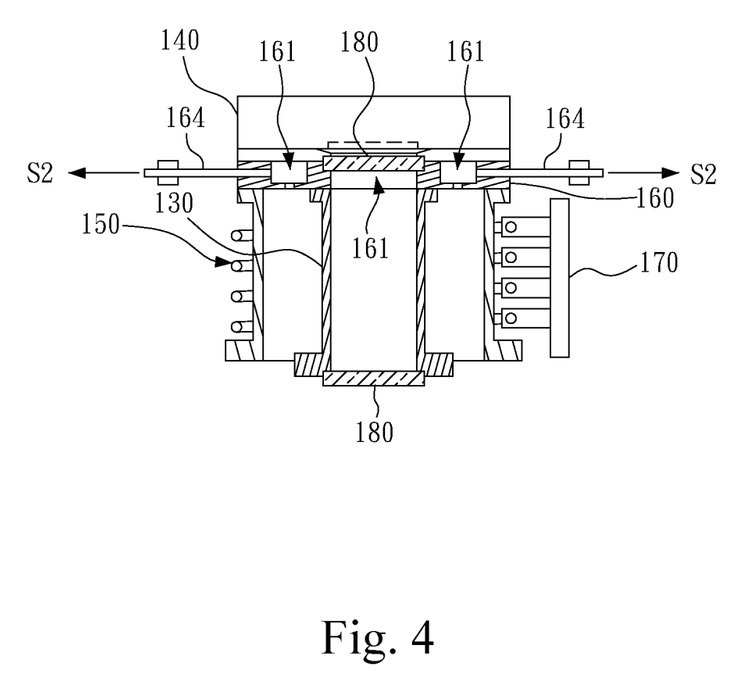

FIG. 3 and FIG. 4 are cross-sectional views of the spacer 160 in different orientations, respectively.

As shown in FIG. 3, the spacer 160 further includes at least one first gas intake line 163. The first gas intake line 163 extends from the outer side surface of the spacer 160 to the center opening 161. The first gas intake line 163 is configured to be connected to a first gas source S1, such that the first gas chamber 131 communicates with the first gas intake line 163 via the center opening 161. The first gas intake line 163 is configured to receive a first gas and introduce the first gas to the first gas chamber 131. The first gas chamber 131 is used to contain the first gas, and the UV light is used to excite the first gas into the excited stage.

As shown in FIG. 4, the spacer 160 further includes at least one second gas intake line 164. The second gas intake line 164 extends from the outer side surface of the spacer 160 to the outer chamber space 162. The second gas intake line 164 is configured to be connected to a second gas source S2, such that the second gas chamber 122 communicates with the second gas intake line 164 through the outer chamber space 162. The second gas intake line 164 is configured to receive the second gas and introduce the second gas to the second gas chamber 122.

The number of first gas intake lines 163 may be a plurality connected to different first gas sources S1, and the different first gas sources S1 each provide a different type of first gas. By switching the valves, a specified type of first gas can be delivered to the first gas chamber 131 on demand. similarly, the number of second air intake lines 164 may be a plurality connected to different second gas sources S2, and the different second gas sources S2 each provide a different type of second gas. By switching the valves, a specified type of second gas can be delivered to the second gas chamber 122 on demand.

As shown in FIG. 1 and FIG. 2, the optoelectronic assisted process chamber further includes two transparent plates 180 respectively sealing the top end and the bottom end of the inner tube body 130, so that the first gas chamber is sealed. The first gas chamber 131 is connected to the first gas source S1 through the first gas inlet line 163, so that the first gas can be filled in the first gas chamber 131. The two transparent plates 180 may be directly coupled to the top and bottom ends of the inner tube body 130, or may be coupled to the spacer 160 and the top cover 110, i.e., the two transparent plates 180 are disposed at the center opening 161 and the window 114, respectively, such that the top and bottom ends of the inner tube body 130 are closed through the top and bottom ends of the inner tube body 130 by coupling to the spacer 160 and the top cover 110, respectively. Specifically, the transparent plate 180 may be a glass with an evaporated film having a fluoride such as magnesium fluoride (MgF2) evaporated on the surface. Evaporated films are mainly selected from materials that do not affect the penetration of UV light and have anti-reflective properties.

As shown in FIG. 1, FIG. 2 and FIG. 4, the induction coil 150 is disposed around the outer tube body 120 for inductively generating an electric field by providing a time-varying magnetic flux to the outer tube body 120. The second gas enters the second gas chamber 122 through the second gas intake line 164. The second gas chamber 122 is used for circulation of the second gas, and the second gas is ionized by the electric field to generate plasma, which is released through the vent holes 115 to the underside of the upper cover 110.

The plasma is ionized by the electric field, accelerated toward the bottom, and released through the vent holes 115 to the underside of the upper cover 110. In an example, the 2-in-1 optoelectronic assisted process chamber further comprises at least one coil holder 170. The induction coil 150 is at least partially secured to the coil holder 170, and the coil holder 170 is removably fixed to the upper surface 111 of the upper cover 110. The induction coil 150 is combined with the coil holder 170 to form a removable coil module. By removing and replacing the coil holder 170, the induction coil 150 set around the outer tube body 120 can be quickly replaced to generate different inductive electric fields as required.

Figure 5:
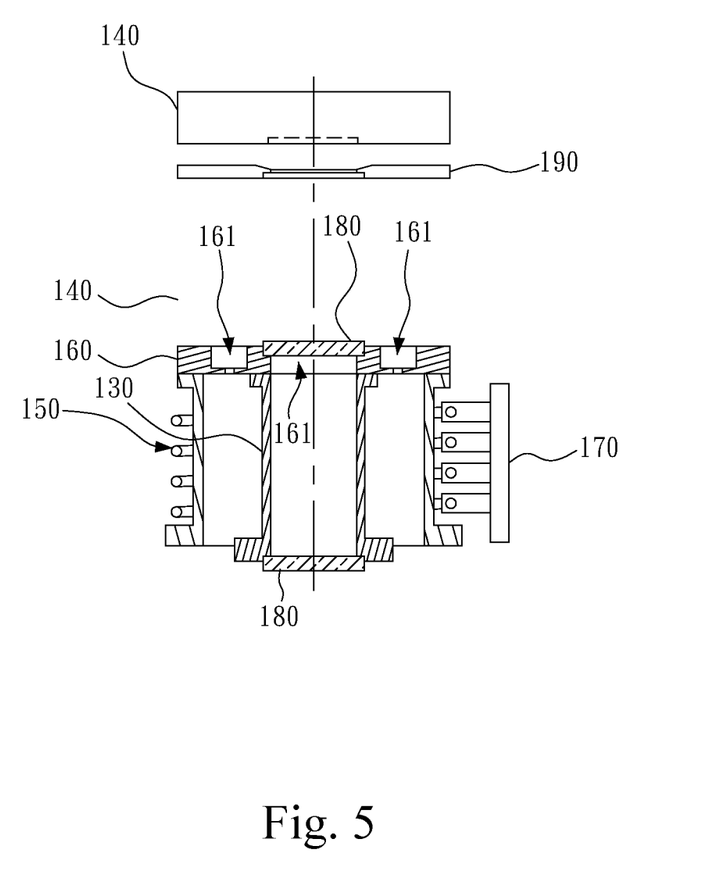
FIG. 5 is cross-sectional exploded view of part of the components of the 2-in-1 optoelectronic assisted process chamber in the embodiment of this disclosure.
Figure 6:
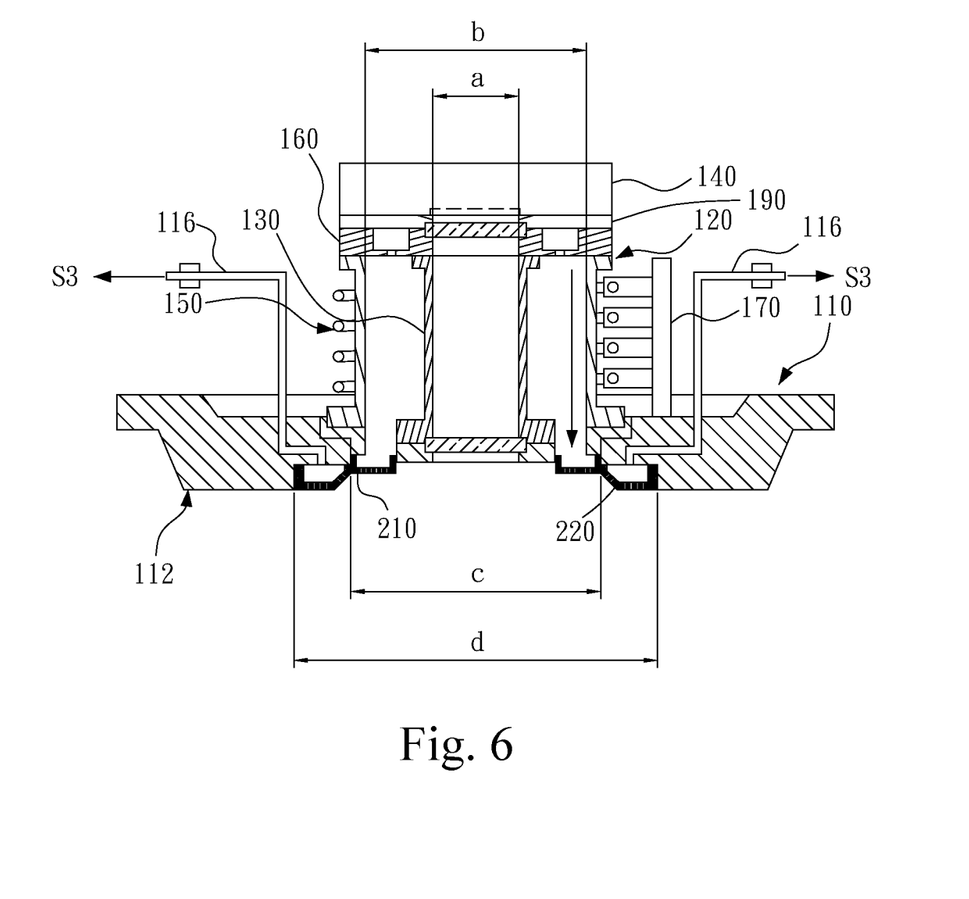
FIG. 6 is another cross-sectional view of the 2-in-1 optoelectronic assisted process chamber in the embodiment of this disclosure.
Figure 7:
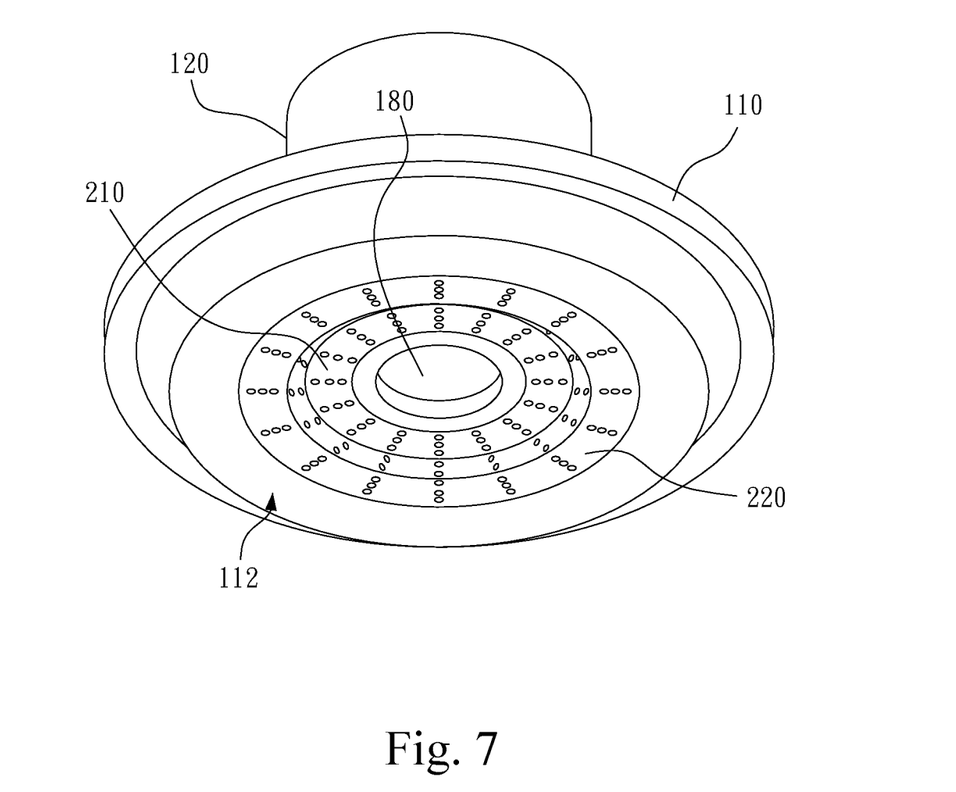
FIG. 7 is perspective view of the upper cover, the first spray head, and second spray head in the embodiment of this disclosure.
Figure 8:
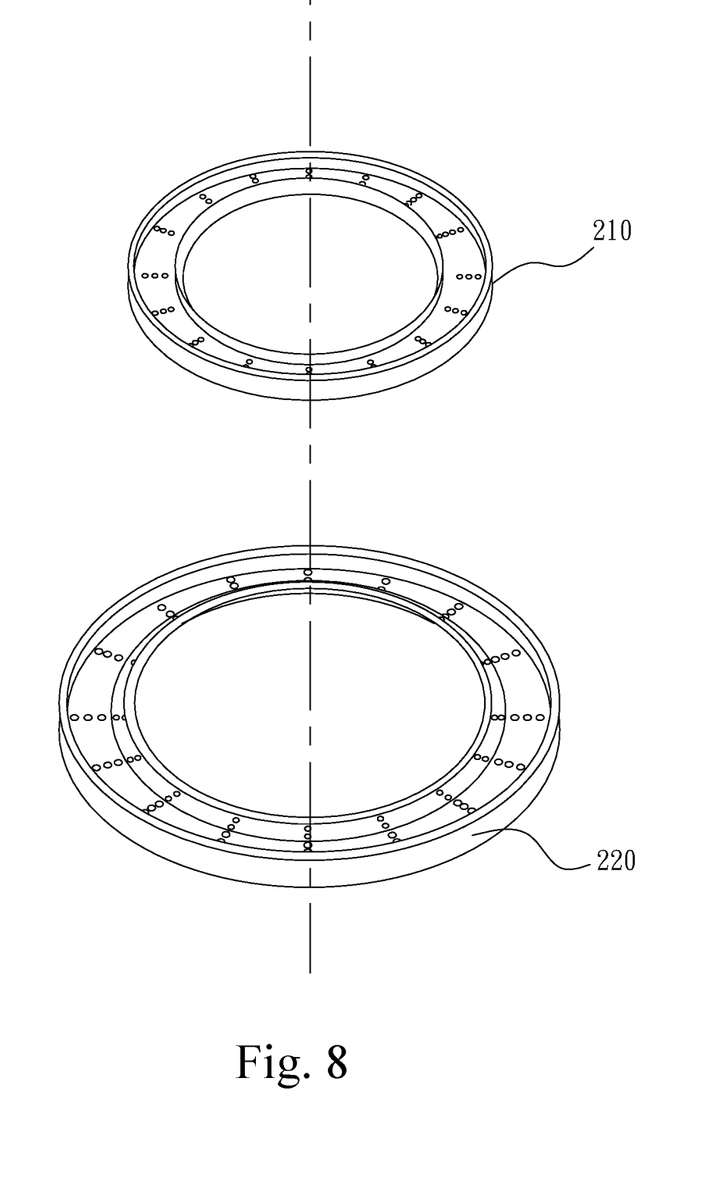
FIG. 8 is perspective view of the first spray head, and second spray head in the embodiment of this disclosure.

As shown in FIG. 5, the optoelectronic assisted process chamber further includes an adapter ring 190. The bottom surface of the adapter ring 190 matches the top of the outer tube body 120 and the inner tube body 130, or matches the spacer 160, to be directly or indirectly fixed to the top of the outer tube body 120 and the inner tube body 130. The top surface of the adapter ring 190 matches the UV light source 140, such that the UV light source 140 can be fixed to the top end of the inner tube body 130 via the adapter ring 190 and/or the spacer 160. As shown in FIG. 6, the inner diameter of the inner tube body 130 is a, the inner diameter of the outer tube body 120 is b, and the ratio of the inner diameter a of the inner tube body to the inner diameter b of the outer tube body is preferably in the range of 0.1 to 0.6 (0.1<a/b<0.6), which provides a better opto-electronic auxiliary process effect.

As shown in FIG. 1, FIG. 2, FIG. 7 and FIG. 8, the optoelectronic assisted process chamber further includes a first spray head 120. The first spray head 210 is in the shape of a ring that is combined with the lower surface 112 of the upper cover 110, surrounds the window 114, and covers the vent holes 115 to form a plasma channel 210a. The plasma channel 210a is also connected to the reaction space 200a of the lower chamber 200. As shown in FIG. 1, The second gas is ionized by the electric field to generate plasma, the plasma is accelerated toward the bottom, and released through the vent holes 115 to the plasma channel 210a. Through the dispersion of the first spray head 210, the plasma can be more evenly dispersed into the reaction space 200a of the lower chamber 200. The first spray head 210 can be electrically grounded or adjust the plasma channel 210a to allow only radical ions to pass through to achieve ion filtration.

As shown in FIG. 1 and FIG. 2, the upper cover 110 further includes a precursor line 116 communicating the upper surface 111 and the lower surface 112. An end of the precursor line 116 on the upper surface 111 is connected to the precursor supply source S3, and the other end of the precursor line 116 on the lower surface 112 is on the outside of the vent holes 115. The optoelectronic assisted process chamber further includes a second spray head 220. The second spray head 220 is also in the shape of a ring that is combined with the lower surface 112 of the upper cover 110, surrounds the first spray head 210. The second spray head 220 covers the end of the precursor line 116 at the lower surface 112 to form a precursor channel 220a. The precursor channel 220a is connected to the reaction space 200a of the lower chamber 200 for uniformly dispersing the precursor into the reaction space 200a.

The plasma channels 210a and the precursor channels 220a respectively provided by the first spray head 210 and the second spray head 220 are mutually isolated, which prevents the problem of clogging the spray head due to deposition of the precursor when the precursor comes into contact with the plasma early. As shown in FIG. 6, specifically, providing an outer diameter of the first spray head 210 is c and an outer diameter of the second spray head 220 is d, a preferred ratio between the outer diameter c of the first spray head 210 and the outer diameter d of the second spray head 220 is between 0.3 and 0.9 (0.3<c/d<0.9)

As shown in FIG. 2, the optoelectronic assisted process chamber further includes a wafer holder located within the reaction space 200a of the lower chamber 200, and the wafer holder 230 is disposed corresponding to the lower surface 112 of the upper cover 110. The wafer holder 230 includes a wafer chuck 232 and a linear actuator 234. A top surface of the wafer chuck 232 faces the lower surface 112 of the upper cover 110, and the wafer chuck 232 is configured to hold a wafer, so as to allow the precursors to be adhered to the surface of the wafer and are assisted by the excitation of light and plasma to form a good atomic layer bonding. In addition, in one embodiment, the wafer chuck 232 is connected to a biasing power source 240 and the biasing power source 240 is configured to apply a bias voltage in the form of a radio frequency on the wafer chuck, so as to generate an electric field to attract plasma or precursors to enhance the deposition on the surface of the wafer. The linear actuator 234 is connected to the bottom surface of the wafer chuck 232 to drive the wafer chuck 232 to linearly move up and down, so as to allow the wafer chuck 232 to approach or move away from the upper cover 110. In addition, in one embodiment, The lower chamber 200 further includes a shielding ring 202 extending in the reaction space 200a and surrounding the wafer chuck 232. In addition, in one embodiment, A heater 236, such as an electric heat pipe or the like, may also be provided inside the wafer chuck 230 for heating the wafer to keep the temperature at the temperature required for the deposition reaction.

Based on the 2-in-1 optoelectronic assisted process chamber, this disclosure provides a UV-assisted and plasma-enhanced process method.

Figure 9:
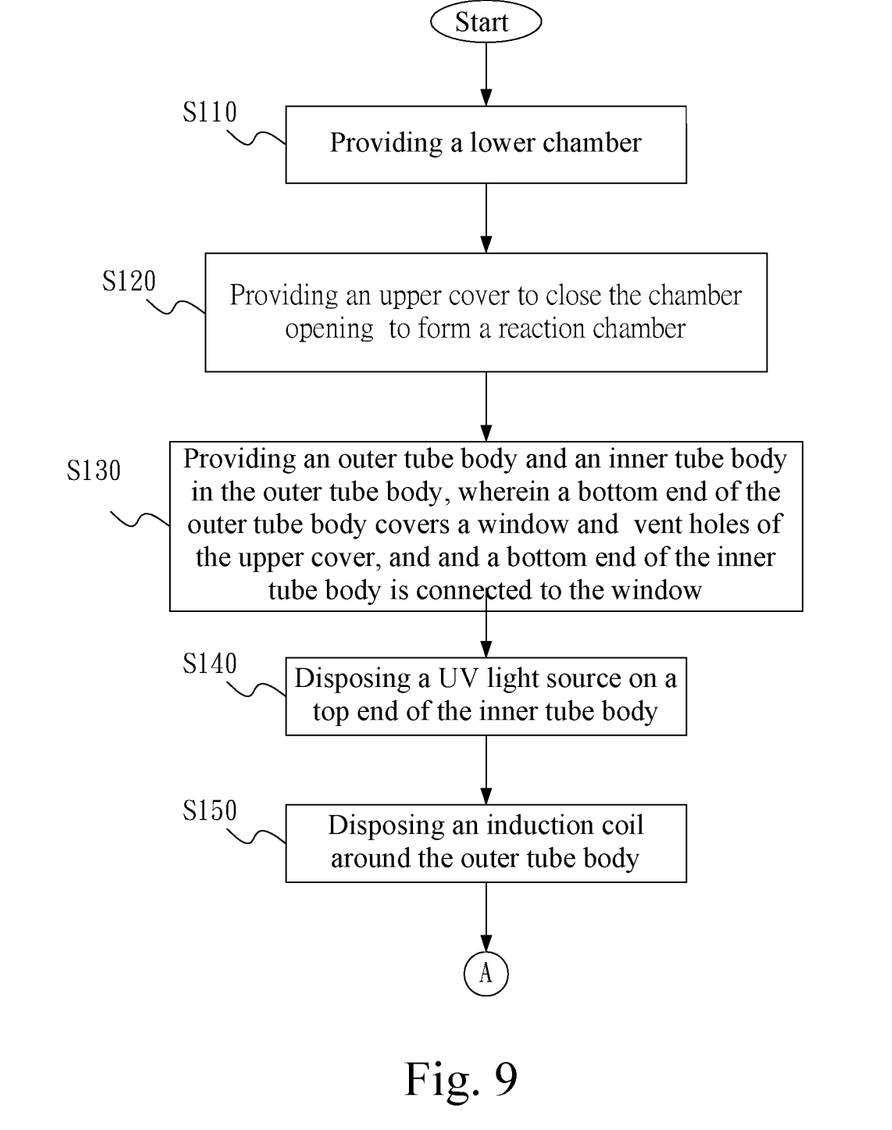
FIG. 9 is a flowchart of the UV-assisted and plasma-enhanced process method of this disclosure.

As shown in FIG. 2 and FIG. 9, the lower chamber 200 includes a reaction space 200a, a top of the lower chamber 200 is provided with a chamber opening 201, and the chamber opening 201 communicates with the reaction space 200a.

As shown in FIG. 1, FIG. 2 and FIG. 9, then the method is to provide an upper cover 110 and seal the chamber opening 201 with the upper cover 110, as shown in step S120. the upper cover 110 includes an upper surface 111 and a lower surface 112, the lower surface 112 of the upper cover 110 faces the reaction space 200a, the upper cover 110 further includes a window 114 and a plurality of vent holes 115 communicate the upper surface 111 and the lower surface 112, and the vent holes 115 are arranged to surround the window 114. In an example, the window 114 and the vent holes 115 are located in the recessed trough 113.

As shown in FIG. 1, FIG. 2 and FIG. 9, next, the method is to dispose an outer tube body 120 and an inner tube body 130; wherein the inner tube body 130 is located within the outer tube body 120, the bottom end of the outer tube body 120 covers the window 114 and the vent holes 115, and the bottom end of the inner tube body 130 is connected to the window 114, as shown in step S130. A first gas chamber 131 is formed inside the inner tube body 130 and the first gas chamber 131 is connected to the window 114. A second gas chamber 122 is formed between the outer tube body 120 and the inner tube body 130, and the second gas chamber 122 is connected to the vent holes 115.

As shown in FIG. 1, FIG. 2 and FIG. 9, the method is to dispose a UV light source 140 on a top end of the inner tube body 130, as shown in step S140. The UV light source 140 is configured to emit an ultraviolet light into the first gas chamber 131, so as to excite a first gas introduced into the first gas chamber 131 into an excited stage.

As shown in FIG. 1, FIG. 2 and FIG. 9, the method is to dispose am induction coil 150 around the outer tube body 120, as shown in step S150. The induction coil 150 is configured to inductively generate an electric field by providing a time-varying magnetic flux to the outer tube body 120, so as to ionize a second gas into plasma.

As shown in FIG. 1, FIG. 2 and FIG. 910, then the method is to introduce the first gas into the first gas chamber 131 and introduce the second gas into the second gas chamber 122, as shown in step S160.

As shown in FIG. 1, FIG. 2 and FIG. 940, finally, the method is to activate the UV light source 140 and the induction coil 150 optionally,
   to emit an excitation light and a plasma via the lower surface 112 of the upper cover 110, as shown in step S170.

Please refer to FIG. 2, the method further includes providing a wafer holder 230 located within the reaction space 200a of the lower chamber 200, wherein the wafer holder 230 is disposed corresponding to the lower surface 112 of the upper cover 110. The wafer holder 230 includes a wafer chuck 232 and a linear actuator 234. A top surface of the wafer chuck 232 faces the lower surface 112 of the upper cover 110, and the wafer chuck 232 is configured to hold a wafer. The linear actuator 234 is connected to the bottom surface of the wafer chuck 232 to drive the wafer chuck 232 to linearly move up and down, so as to allow the wafer chuck 232 to approach or move away from the upper cover 110. The wafer chuck 232 is further connected to a biasing power source 240, and the biasing power source 240 is configured to apply a bias voltage in the form of a radio frequency on the wafer chuck, so as to generate an electric field to attract plasma or precursors to enhance the deposition on the surface of the wafer.

As shown in FIG. 1, FIG. 2, FIG. 7 and FIG. 8, the method further includes a first spray head 210 combined with the lower surface 112 of the upper cover 110 and surrounding the window 114, and the first spray head 210 covers the vent holes 115 to form a plasma channel 210a. The plasma channel 210a communicates with the reaction space 200a of the lower chamber 200. The first spray head 210 is configured to uniformly disperse the plasma into the reaction space 200a of the lower chamber 200. The method further includes a second spray head 220 combined with the lower surface 112 of the upper cover 110, and the second spray head 220 covers the end of a precursor line 116 at the lower surface 112 to form a precursor channel 220a.

The precursor channel 220a is connected to the reaction space 200a of the lower chamber 200 for uniformly dispersing the precursor into the reaction space 200a.

As shown in FIG. 2, FIG. 3 and FIG. 4, the step of providing the UV light source 140 at the top of the inner tube body 130 further comprises disposing a spacer 160 connected to the top ends of the outer tube body 120 and the inner tube body 130, and combining the UV light source 140 with the spacer 160. As shown in the drawings, the spacer includes a center opening 161 and an outer chamber space 162, the center opening 161 communicates with the first gas chamber 131, and the outer chamber space 162 communicates with the second gas chamber 122.

As shown in FIG. 3 and FIG. 4, In addition, in one embodiment, the method further includes disposing at least one first gas intake line 163 in the spacer 160. The first gas intake line 163 extends from the outer side surface of the spacer 160 to the center opening 161. The first gas intake line 163 is configured to receive a first gas and introduce the first gas to the first gas chamber 131. the spacer 160 further includes at least one second gas intake line 164. The second gas intake line 164 extends from the outer side surface of the spacer 160 to the outer chamber space 162. The second gas intake line 164 is configured to receive the second gas and introduce the second gas to the second gas chamber 122.

As shown in FIG. 1 to FIG. 5, in addition, in one embodiment, the step S120 of disposing the outer tube body 120 and the inner tube body 130 further includes disposing two transparent plates 180 to seal the top end and the bottom end of the inner tube body 130, so that the first gas chamber is sealed.

As shown in FIG. 1 and FIG. 2, the step of disposing the induction coil 150 around the outer tube body 120 further includes a coil holder 170 fixing the induction coil 150 to the coil holder 170 and removably fixing the coil holder 170 to the upper surface of the upper cover 110.

As shown in FIG. 1, FIG. 2 and FIG. 5, In addition, in one embodiment, before disposing the UV light source 140, the method further includes providing an adapter ring 190 combined with the UV light source 140 and combined with the top ends of the outer tube body 120 and the inner tube body 130, so as to allow the UV light source 140 to be fixed to the top end of the inner tube body 130 through the adapter ring 190 and/or the spacer 160.

Based on the 2-in-1 optoelectronic assisted process chamber and the UV-assisted and plasma-enhanced process method, UV-assisted and plasma-enhanced functions can be combined in a single design. A single design combines both UV-assisted and plasma-enhanced functions, or it can be implemented in either UV-assisted or plasma-enhanced without transferring wafers between different equipment, which can effectively increase the efficiency of the ALD/ALE process.

What is claimed is:

1. A 2-in-1 optoelectronic assisted process chamber, comprising: a lower chamber with an accommodating space, wherein a top of the lower chamber is provided with a chamber opening; an upper cover, including an upper surface and a lower surface; wherein the upper cover further includes a window and a plurality of vent holes communicating the upper surface and the lower surface, and the vent holes are arranged to surround the window; wherein the upper cover seals the chamber opening with the lower surface facing a reaction space to form a reaction chamber; an outer tube body with a bottom end disposed on the upper surface and covering the window and the vent holes; an inner tube body with a bottom end disposed on the upper surface and connected to the window; wherein the inner tube body is disposed within the outer tube body; a first gas chamber is formed inside the inner tube body and the first gas chamber is connected to the window; and a second gas chamber is formed between the outer tube body and the inner tube body, and the second gas chamber is connected to the vent holes; a UV light source disposed on a top end of the inner tube body for emitting an ultraviolet light into the first gas chamber; two transparent plates respectively sealing the top end and the bottom end of the inner tube body, so that the first gas chamber is sealed; and an induction coil disposed around the outer tube body for inductively generating an electric field by providing a time-varying magnetic flux to the outer tube.

2. The 2-in-1 optoelectronic assisted process chamber according to claim 1, further comprising a wafer holder located within the reaction space of the lower chamber; wherein the wafer holder is disposed corresponding to the lower surface of the upper cover; the wafer holder includes a wafer chuck, a linear actuator, and a biasing power source; a top surface of the wafer chuck faces the lower surface of the upper cover, the linear actuator is connected to a bottom surface of the wafer chuck to linearly move the wafer chuck up and down; and the wafer chuck is connected to the biasing power source and the biasing power source is configured to apply a bias voltage on the wafer chuck.

3. The 2-in-1 optoelectronic assisted process chamber according to claim 1, further comprising a first spray head combined with the lower surface of the upper cover and surrounding the window and covering the vent holes.

4. The 2-in-1 optoelectronic assisted process chamber according to claim 3, wherein the upper cover further includes a precursor line communicating with the upper surface and the lower surface, an end of the precursor line located on the upper surface is configured to connect to a precursor supply source, and the end of the precursor line on the lower surface is on an outer side of the vent holes.

5. The 2-in-1 optoelectronic assisted process chamber according to claim 4, further comprising a second spray head combined with the lower surface of the upper cover and covers an end of a precursor line located on that lower surface; wherein a ratio between an outer diameter of the first spray head and an outer diameter of the second spray head is between 0.3 and 0.9.

6. The 2-in-1 optoelectronic assisted process chamber according to claim 1, wherein a ratio between an inner diameter of the inner tube and an inner diameter of the outer tube body is between 0.1 and 0.6.

7. The 2-in-1 optoelectronic assisted process chamber according to claim 1, further comprising a spacer connected to the top end of the inner tube body, and to a top end of the outer tube body, and the UV light source is combined with spacer.

8. The 2-in-1 optoelectronic assisted process chamber according to claim 7, wherein the spacer further includes: at least one first gas intake line within the spacer extending from an outer side surface of the spacer to the center opening, wherein the at least one first gas intake line is configured to be connected to a first gas source such that the first gas chamber communicates with the at least one first gas intake line through the center opening, and the first gas chamber is configured to receive a first gas and introduce the first gas to the first gas chamber, and at least one second gas intake line intake line within the spacer extending from an outer side surface of the spacer to an outer chamber space, wherein the at least one second gas intake line is configured to be connected to a second gas source such that the second gas chamber communicates with the at least one second gas intake line through the outer chamber space, and the at least one second gas intake line is configured to receive a second gas and introduce the second gas to the second gas chamber.

9. The 2-in-1 optoelectronic assisted process chamber according to claim 1, further comprising an adapter ring directly or indirectly connected to the top end of the inner tube body, and to a top end of the outer tube body, wherein a top surface of the adapter ring matches the UV light source such that the UV light source is combined with the top end of the inner tube body through the adapter ring.

* * * * *